United States Patent [19]
Tobler

[11] Patent Number: 5,446,921
[45] Date of Patent: Aug. 29, 1995

[54] CIRCUIT FOR DETECTING NOISE AND PRODUCING A SQUELCH SIGNAL

[75] Inventor: Ulrich J. Tobler, Exton, Pa.

[73] Assignee: General Electric Company, Malvern, Pa.

[21] Appl. No.: 104,239

[22] Filed: Aug. 9, 1993

Related U.S. Application Data

[63] Continuation of Ser. No. 426,783, Oct. 25, 1989, abandoned.

[51] Int. Cl.⁶ .............................................. H04B 1/10
[52] U.S. Cl. ................................... 455/221; 455/222; 455/312; 375/351
[58] Field of Search ............... 455/218, 221, 222, 225, 455/296, 303, 312; 307/234; 375/104

[56] References Cited

U.S. PATENT DOCUMENTS

| | | | |
|---|---|---|---|
| 3,546,607 | 12/1970 | Dixon | 375/104 |
| 3,633,112 | 1/1972 | Anderson | 455/221 |
| 3,824,470 | 7/1974 | Eastmond | 455/35 |
| 3,904,969 | 9/1975 | Eastmond | 455/221 |
| 4,232,387 | 11/1980 | Cottatellucci | 375/55 |
| 4,806,853 | 2/1989 | Fleischer et al. | 455/67.1 |

*Primary Examiner*—Edward F. Urban
*Attorney, Agent, or Firm*—Henry J. Policinski; William H. Murray; Robert E. Rosenthal

[57] ABSTRACT

An apparatus for detecting noise in communications channels in electrical power transmission systems and generating squelch signals, for transfer-trip receivers for performing protection and control functions, detects changes in a period of an analog signal and generates a signal in response to such changes. The apparatus receives an analog signal, generates zero-pulses corresponding to zero-transitions of the analog signal, generates an error pulse when an interval between successive ones of the zero-pulses either exceeds a preselected long window interval or is less than a preselected short window interval, and generates, in response to the error pulse, a squelch signal.

20 Claims, 3 Drawing Sheets

CIRCUIT FOR DETECTING NOISE AND PRODUCING A SQUELCH SIGNAL

This is a continuation of application Ser. No. 07/426,783 filed on Oct. 25, 1989, now abandoned.

BACKGROUND OF THE INVENTION

This invention relates to apparatus for receiving and executing commands transmitted by means of a modulated carrier signal, and more particularly to apparatus of this type, such as transfer-trip receivers, for performing protection and control functions at substations in electrical power transmission systems.

A transfer-trip receiver is a device used at substations to perform protection functions, for example, to interrupt and reconnect high-voltage power breakers in transmission lines upon command. The commands are sent utilizing a carrier signal which is transmitted over the electrical power transmission lines which extend from one substation to another substation.

Transfer-trip receivers and related communication equipment employ narrow band receivers. Power lines, particularly during fault conditions, are noisy. Some portion of this noise typically will enter the narrow band channel that is used for communications. As a result, receivers may interpret noise as a command to open a breaker, thereby producing unnecessary interruptions in service.

As a result, it has become common to equip receivers with squelch schemes that detect noise and block the output of the receivers when noise is detected. It is known to measure the amplitude of analog signals and, where the amplitude falls outside a predetermined range, interpret such a change in amplitude as noise and accordingly generate a squelch signal. However, it has been found in such squelch schemes that security against erroneous interpretation of noise as commands is inversely related to dependability for detection of actual commands. This follows from the fact that reduction of squelching action under noisy conditions decreases security by increasing the possibility that noise will be interpreted as a command, while assuring that a squelch detection system will not interpret a genuine command as noise.

OBJECTS OF THE INVENTION

It is an object of this invention to provide an apparatus for detecting noise in a narrow band signal and producing a squelch signal when such noise is detected.

It is another object of this invention to provide an apparatus for detecting noise in a noisy transmission system wherein security against erroneous interpretation of noise as commands can be increased without a corresponding reduction in dependability for detecting accurate signals.

Further objects and advantages of this invention will become apparent from the description of the invention which follows.

SUMMARY OF THE INVENTION

An apparatus for detecting noise and generating squelch signals includes means for receiving an analog signal, means for generating zero-pulses corresponding to zero-transitions of the analog signal, means for generating an error pulse when an interval between successive ones of the zero-pulses either exceeds a preselected long window interval or is less than a preselected short window interval, and means for generating, in response to the error pulse, a squelch signal.

A method of detecting noise and generating squelch signals includes the steps of receiving an analog signal, generating zero-pulses corresponding to zero-transitions of the analog signal, generating an error pulse when an interval between successive ones of the zero-pulses either exceeds a preselected long window interval or is less than a preselected short window interval, and generating, in response to the error pulse, a squelch signal.

DETAILED DESCRIPTION OF THE INVENTION

Figure 1:
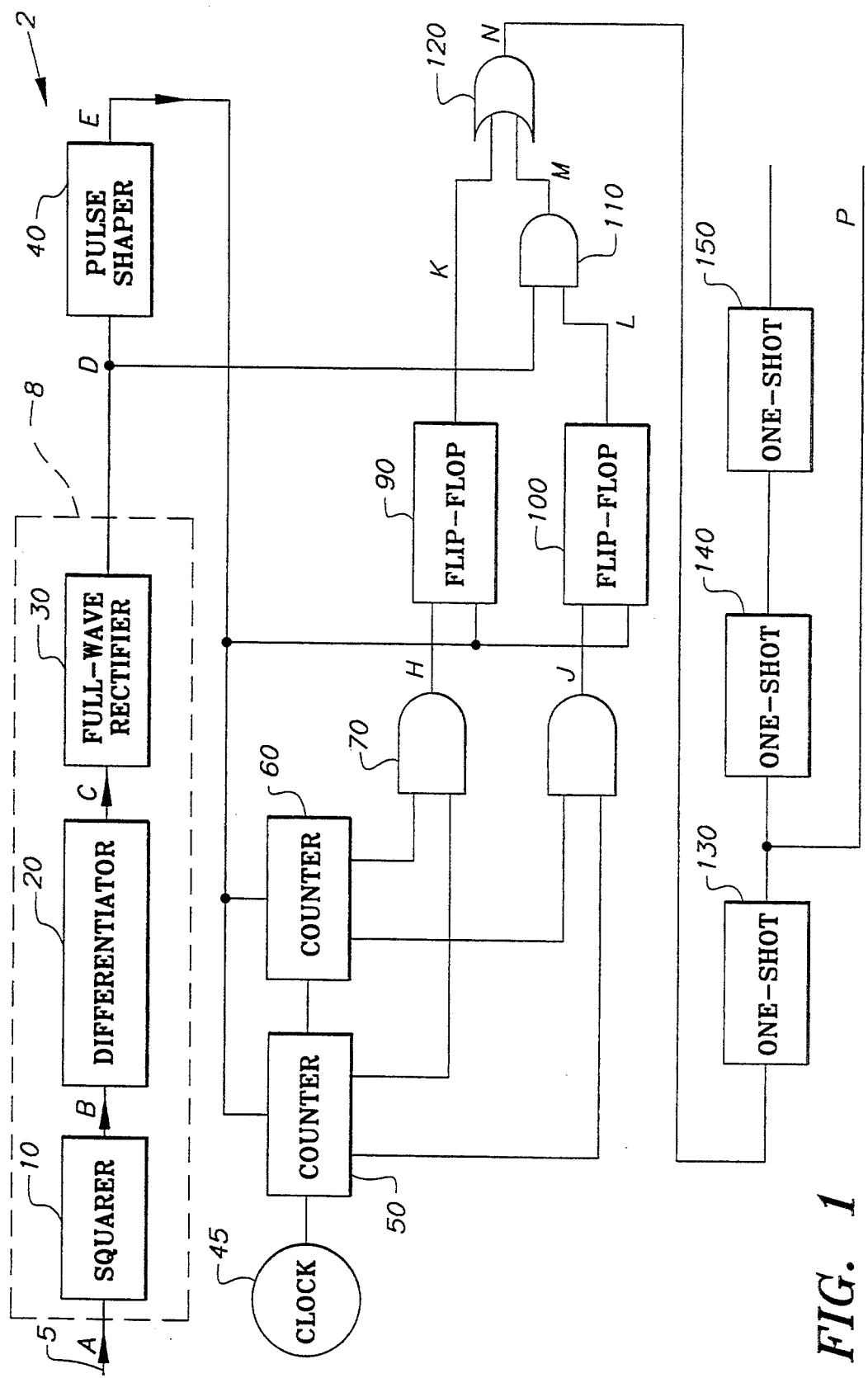
FIG. 1 is a block diagram of a preferred embodiment of a digitally-based noise squelch apparatus in accordance with the invention.
Figure 2:
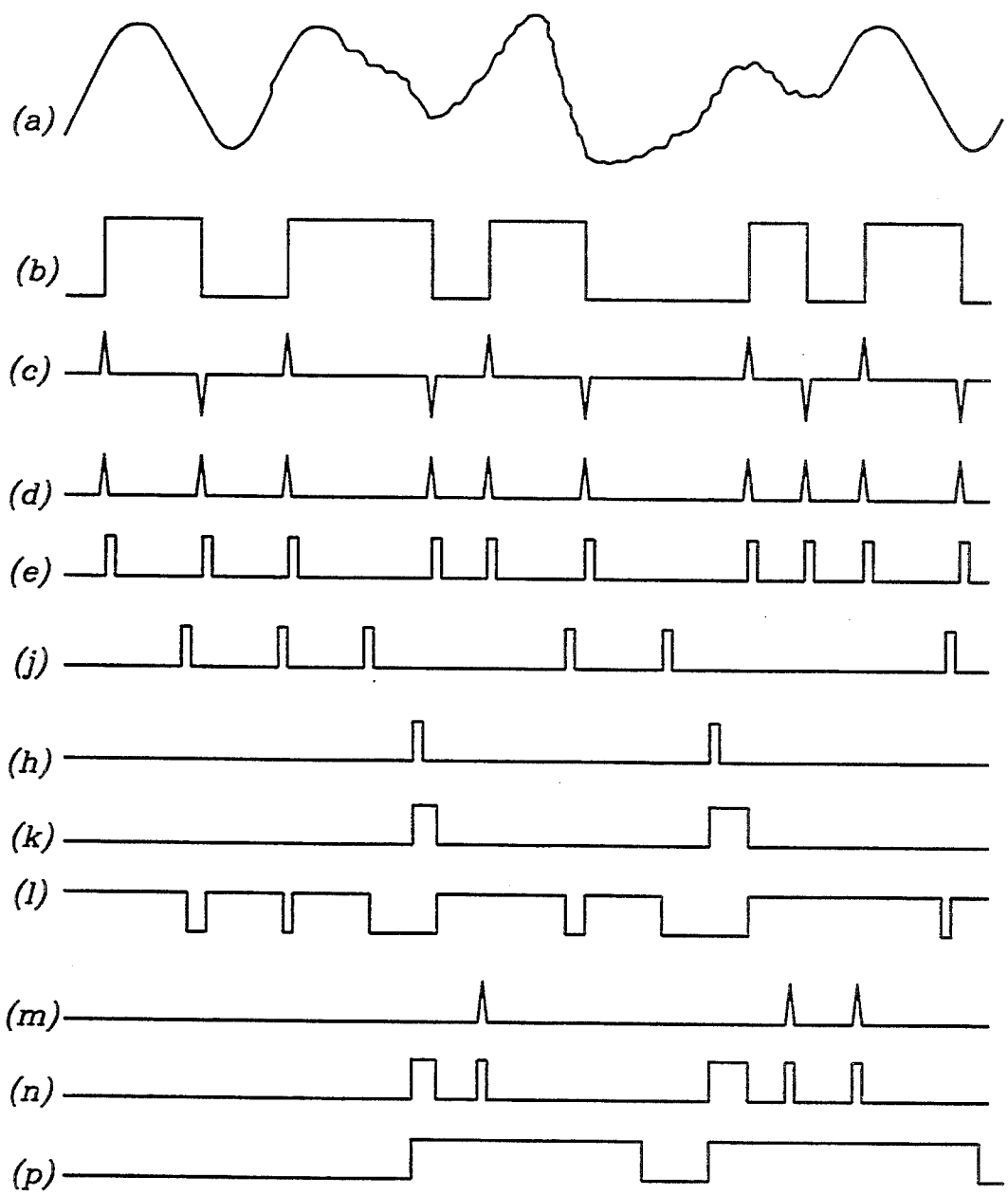
FIG. 2(a–p) shows the wave form of signals at various points in the block diagram of FIG. 1.

Referring to FIG. 1, an apparatus, generally designated 2, for detecting noise and generating squelch signals in accordance with the present invention is shown. An analog signal that has been transmitted along an electrical power transmission line (not shown) to a receiver (not shown) and then demodulated is applied to an input 5. The shape of a wave form of such a signal at point A is shown in FIG. 2(a). On the left hand side of FIG. 2(a), the signal is transmitted without noise and has a smooth sinusoidal shape. Near the center of the figure, noise is added to the signal, so that the wave form of the signal no longer has a smooth sinusoidal shape. At the right hand side of FIG. 2(a), the signal again is free of noise, and the wave form has a smooth sinusoidal shape.

The first portion of the circuit, included within dotted line 8, generates a series of pulses, each of which corresponds to a zero-transition of the signal at A. A "zero-transition" is a point at which the wave form of the signal A crosses the horizontal axis. The analog signal is received by a squarer 10. The output of squarer 10, at point B in FIG. 1, is a square wave, shown at FIG. 2(b). The square wave has uniform amplitude, with substantially sharp transitions between a low value and a high value. Each transition of the square wave corresponds to a zero-transition of the signal at A. The output of the squarer 10 is connected to the input of a differentiator 20.

The output of the differentiator 20, which is shown at FIG. 1 as occurring at point C, is depicted in FIG. 2(c). As can be seen by comparing FIG. 2(c) with FIG. 2(b), for each zero-transition in the signal in FIG. 2(b), there is a short pulse in the signal in FIG. 2(c). Positive short pulses correspond to transitions from a low level to a high level. Negative short pulses correspond to transitions from a high level to a low level. It will be seen that these short pulses are of alternate polarity. The output of differentiator 20 is connected to a full-wave rectifier 30. The output of the full-wave rectifier 30, which is shown in FIG. 1 at point D, is depicted in FIG. 2(d). The short pulses of alternative polarity depicted in FIG. 2(c) are converted to short pulses all having the same polarity. Each of these pulses is referred to as a "zero-pulse."

When the signal at A in FIG. 1 is noise-free, the wave form of the signal has a smooth sinusoidal shape. Accordingly, the corresponding interval between zero-pulses is constant. Where zero-pulses follow each other at constant intervals, the interval is referred to as the "nominal time." However, when noise is present in the signal at A, the intervals between zero-pulses will be either shorter or longer than the nominal time. Thus, in the central portion of FIG. 2(d), the intervals between pulses vary. The intervals vary because the pulses in that portion of the Figure correspond to zero-transitions in the noisy part of the analog signal, depicted in the central portion of FIG. 2(a).

The purpose of the remainder of the apparatus 2 is to detect such variations in the length of the intervals between pulses and to produce a squelch signal in the event that the intervals between the pulses are longer than the preselected long window interval or shorter than the preselected short window interval, which are discussed below.

The output of full-wave rectifier 30 is connected to an input of pulse shaper 40. Pulse shaper 40 produces, at point E in FIG. 1, the output depicted in FIG. 2(e). In this output, each pulse received from full-wave rectifier 30 has a substantially uniform, rectangular wave form.

A clock 45 generates a clock signal. This clock signal is fed into a first divide-by-ten counter 50. First counter 50, which has ten outputs, generates consecutive pulses at its outputs for each clock pulse. The last of the ten outputs is connected to a second divide-by-ten counter 60. Second divide-by-ten counter 60 generates consecutive pulses at its ten outputs for each pulse received from first counter 50. The output of pulse shaper 40 is referred to as the "reset pulse." The reset pulse resets each of first counter 50 and second counter 60. One output of first counter 50 is connected to a first input of AND gate 70. One output of second counter 60 is connected to a second input of AND gate 70. AND gate 70 is referred to as the "long window AND gate." The outputs of first counter 50 and second counter 60 to be connected to inputs of long window AND gate 70 are selected so that long window AND gate 70 produces a pulse. This pulse is produced only if a certain preselected period of time passes between zero-pulses. This preselected period of time is referred to for definitional purposes as the "long window interval." The particular outputs are selected depending on the desired length of the long window interval. It is well known in the art of electronic circuit design how to calculate which outputs should be connected in order to obtain a given long window interval. The long window interval is slightly greater than the nominal time between zero-pulses. An example of the output of long window AND gate 70 at point H in FIG. 1 is depicted in FIG. 2(h). As shown in FIG. 2(h), a signal is produced only where the time between the zero-pulses shown in FIG. 2(e) exceeds the long window interval.

One output of first counter 50 is connected to a first input of AND gate 80. One output of second counter 60 is connected to a second input of AND gate 80. AND gate 80 is referred to as the "first short window AND gate." Outputs of first counter 50 and second counter 60 to be connected to inputs of first short window AND gate 80 are selected so that the output of first short window AND gate 80 is a pulse, at point J. This pulse follows a zero-pulse by a preselected period of time. This period of time is referred to for definitional purposes as the "short window interval." The outputs to be connected are selected depending on the desired length of the short window interval. It is well known in the art of electronic circuit design how to calculate which outputs should be connected to achieve a given length of the short window interval. The short window interval is shorter than the nominal time between zero-pulses. The signal at J is depicted in FIG. 2(j). When the interval between pulses in FIG. 2(e) is less than the short window interval, no signal will be produced by first short window AND gate 80. Thus, where there is no noise in the analog signal at A, first short window AND gate 80 produces a steady series of pulses. Where there is no noise in the signal at A, long window AND gate 70 produces no pulses.

The output of long window AND gate 70 is connected to a set input of flip-flop 90. Flip-flop 90 is referred to as the "long window flip-flop." The other input, or reset input, of long window flip-flop 90 is connected to the "reset pulse," or output of pulse shaper 40, shown in FIG. 1 as the signal at E. The output of long window flip-flop 90 is a signal that is triggered when there is a signal in the output of long window AND gate 70. This signal ends when the next reset pulse occurs. Thus, the output of long window flip-flop 90 goes high when the time period since the most recent reset pulse is longer than the long window interval. The output of long window flip-flop 90 then stays high, and returns to low when a reset pulse occurs. The output of long window flip-flop 90, at point K in FIG. 1, is depicted in FIG. 2(k).

The output of first short window AND gate 80 is connected to a set input of flip-flop 100. Flip-flop 100 is referred to as the "short window flip-flop." The other input, or reset input, of short window flip-flop 100 is connected to the reset pulse, or output of pulse shaper 40. The output of short window flip-flop 100 at point L in FIG. 1 is depicted in FIG. 2(l). This output is a signal that goes high when a reset pulse is received, and goes low when a pulse from short window AND gate 80 is received. The output of short window flip-flop 100 is connected to a first input of AND gate 110. AND gate 110 is referred to as the "second short window AND gate." A second input of second short window AND gate 110 is connected to the output of the full-wave rectifier 30, which is the zero-pulse signal. Accordingly, the output of second short window AND gate 110 is a pulse. This pulse is produced whenever a zero-pulse occurs less than the short window interval after the preceding zero-pulse. This output, at point M in FIG. 1, is depicted in FIG. 2(m).

The output of second short window AND gate 110 is connected to an input of OR gate 120. The other input of OR gate 120 is connected to the output of long window flip-flop 90. As a result, the output of OR gate 120 is a signal that goes high whenever the interval between the zero-transitions is either longer than a desired period or shorter than a desired period. This signal, at point N in FIG. 1, is depicted in FIG. 2(n). This signal is referred to as the "error pulse."

The error pulse is fed into the input of one-shot 130. One-shot 130 produces a squelch signal of a desired duration in response to an error pulse. This signal is then used to squelch the output of a receiver, so that the receiver does not instruct any components to trip circuits. One-shot 130 is of the retriggerable type. Accordingly, the output signal, at point P in FIG. 1 and depicted in FIG. 2(p), will go high upon receiving an error pulse. The output signal will stay high until the desired time period after the most recent error pulse has elapsed. This output signal is referred to as the "fast squelch." One-shot 140 is connected to the output of one-shot 130. One-shot 140 has a pick-up delay. The output of one-shot 140 is connected to the input of one-shot 150, which has a drop-out delay. Accordingly, when the signals produced by the output of one-shot 130 become very long, as in very noisy conditions, the output of one-shot 150 also produces a squelch signal. The output of one-shot 150 is referred to as the "noise squelch." This output is also used to squelch the output of the receiver.

Figure 3:
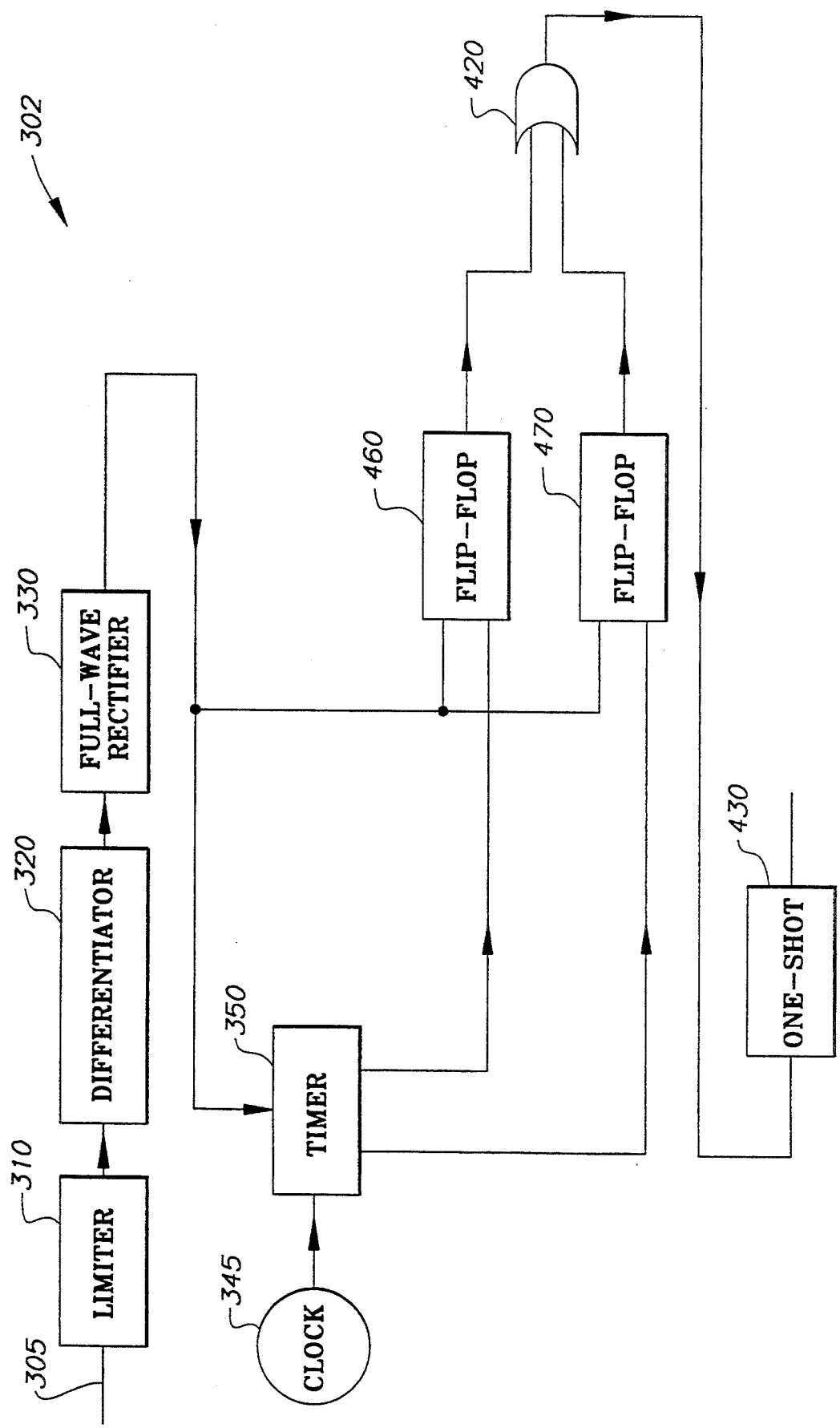
FIG. 3 is a diagram of an alternative embodiment of a digitally-based noise squelch apparatus in accordance with the invention.

An alternative embodiment of an apparatus, generally designated 302, for detecting noise and generating squelch signals in accordance with the present invention is shown in FIG. 3. An analog signal, which has been transmitted along an electrical power transmission line (not shown) to a receiver (not shown) and demodulated is applied to an input 305. Input 305 is connected to a limiter 310. The output of limiter 310 is a square wave, or nearly-square wave. Each transition between a high and a low value of the square wave corresponds to a zero-transition of the analog signal. The output of limiter 310 is connected to the input of a differentiator 320. The output of differentiator 320 is a series of pulses, each pulse corresponding to a transition in the square wave. These pulses are of alternate polarity. The output of the differentiator is then connected to a full-wave rectifier 330. The output of full-wave rectifier 330 is a signal in the form of a series of pulses of the same polarity. This output is referred to as the zero-pulse. The zero-pulse is a digital signal. A high state in the zero-pulse corresponds to a zero-transition of the analog signal. A low state in the zero-pulse corresponds to an interval between such zero-transitions.

The output of full-wave rectifier 330, the zero-pulse, is connected to an input of timer 350, so as to reset timer 350. A clock 345 is also connected to timer 350. A first output of timer 350 is connected to an input of short window flip-flop 460. A second output of timer 350 is connected to an input of long window flip-flop 470. Another input of short window flip-flop 460 is connected to an output of full-wave rectifier 330, or the zero-pulse. A period of time beginning at a zero-pulse and lasting slightly less than the nominal time between zero-pulses is referred to as the "short window." In short window flip-flop 460, if a zero-pulse is received during the short window, then a short pulse is generated.

Another input of long window flip-flop 470 is connected to an output of full-wave rectifier 330, or the zero-pulse. A period of time beginning at a zero-pulse and slightly longer than the nominal time between zero-pulses is referred to as the "long window." In long window flip-flop 470, if no zero-pulse is received during the long window, then a continuous error signal is generated. The error signal continues until a zero-pulse is received. The output of the short window flip-flop and the output of the long window flip-flop are both connected to OR gate 420. The output of OR gate 420 is an error pulse. This error pulse is a signal that goes high when the time between zero-pulses is either too long or too short. The output of OR gate 420 is connected to one-shot 430. One-shot 430 is of the retriggerable type. One-shot 430 generates a squelch signal for a certain period of time after the end of each error pulse.

It will be appreciated that there are considerable variations that can be accomplished in a method and article of the invention without departing from its scope. As a result, although a preferred embodiment of an apparatus and method of the invention has been described above, it is emphasized that the invention is not limited to a preferred embodiment, and there exist alternative embodiments that are fully encompassed within the invention's scope, which is intended only to be limited by the scope of the appended claims.

What is claimed is:

1. An apparatus for detecting noise and generating squelch signals, comprising:
   (a) means for receiving an analog signal;
   (b) means for generating a plurality of zero-pulses corresponding to zero transitions of said analog signal;
   (c) means for generating an error pulse when an interval between any one of said zero-pulses and a next succeeding one of said zero-pulses either (i) exceeds a preselected long window interval or (ii) is less than a preselected short window interval; and
   (d) means for generating, in response to said error pulse, a squelch signal,
   wherein said means for generating an error pulse when a period of time between successive ones of said zero-pulses exceeds a preselected long window interval comprises:
   means for establishing a time delay equal to said preselected long window interval, said establishing means being reset by each one of said zero-pulses.

2. An apparatus as recited in claim 1, wherein said means for generating, in response to said error pulse, a squelch signal comprises at least one one-shot.

3. An apparatus as recited in claim 1, wherein said means for generating a plurality of zero-pulses comprises:
   (a) a squarer, an input of said squarer being connected to said means for receiving;
   (b) a differentiator, an input of said differentiator being connected to an output of said squarer; and
   (c) a full-wave rectifier, an input of said full-wave rectifier being connected to an output of said differentiator.

4. An apparatus as recited in claim 1, wherein said establishing means comprises first counter means, reset by said zeros-pulses and clocked by clock means; and second counter means reset by said zero-pulses and clocked by an output of said first counter means.

5. An apparatus as recited in claim 4, wherein said means for generating an error pulse when a period of time between successive ones of said zero-pulses exceeds a preselected long window interval further comprises:
   (a) a long window AND gate, a first input of which is connected to a selected output of said first counter means, and a second input of which is connected to a selected output of said second counter means; and
   (b) a long window flip-flop, a set input of which is connected to an output of said long window AND gate, and a reset input of which is connected to an output of said means for generating a plurality of zero-pulses.

6. An apparatus for detecting noise and generating squelch signals, comprising:
   (a) means for receiving an analog signal;
   (b) means for generating a plurality of zero-pulses corresponding to zero transitions of said analog signal;

(c) means for generating an error pulse when an interval between any one of said zero-pulses and a next succeeding one of said zero-pulses either (i) exceeds a preselected long window interval or (ii) is less than a preselected short window interval; and (d) means for generating, in response to said errors pulse, a squelch signal, wherein said means for generating an error pulse when a period of time between successive ones of said zero-pulses is less than a preselected short window interval comprises means establishing a time delay equal to said preselected short window interval, said establishing means being reset by each one of said zero-pulses.

7. An apparatus as recited in claim 6, wherein said means for generating a plurality of zero-pulses comprises:

(a) a squarer, an input of said squarer being connected to said means for receiving;

(b) a differentiator, an input of said differentiator being connected to an output of said squarer; and (c) a full-wave rectifier, an input of said full-wave rectifier being connected to an output of said differentiator.

8. An apparatus as recited in claim 6, wherein said means for generating, in response to said error pulse, a squelch signal, comprises at least one one-shot.

9. An apparatus as recited in claim 6, wherein said establishing means comprises first counter means, reset by said zero-pulses, and clocked by clock means, and second counter means, reset by said zero-pulses and clocked by an output of said first counter means.

10. An apparatus as recited in claim 9, wherein said means for generating an error pulse when a period of time between successive ones of said zero-pulses is less than a preselected short window interval further comprises:

(a) a first short window AND gate, a first input of which is connected to a selected output of said first counter means, and a second input of which is connected to a selected output of said second counter means;

(b) a short window flip-flop, a set input of which is connected to an output of said first short window AND gate, and a reset input of which is connected to an output of said means for generating a plurality of zero-pulses; and (c) a second short window AND gate, a first input of which is connected to an output of said short window flip-flop, and a second input of which is connected to an output of said means for generating a plurality of zero-pulses.

11. A method of detecting noise and generating squelch signals, comprising the steps of:

(a) receiving an analog signal;

(b) generating a plurality of zero-pulses corresponding to zero-transitions of said analog signal;

(c) generating an error pulse when an interval between any one of said zero-pulses and a next succeeding one of said zero-pulses either (i) exceeds a preselected long window interval or (ii) is less than a preselected short window period; and (d) generating, in response to said error pulse, a squelch signal, wherein said step of generating an error pulse when an interval between successive ones of said zero pulses exceeds a preselected long window interval comprises the steps of providing means for establishing a time delay equal to said predetermined long window interval and resetting said time delay by each of said zero-pulses.

12. A method as recited in claim 11, wherein said step of generating a plurality of zero-pulses corresponding to zero-transitions of said analog signal, comprises the steps of:

(a) squaring said received analog signal to produce a squared signal;

(b) differentiating said squared signal to produce a differentiated signal; and (c) full-wave rectifying said differentiated signal.

13. A method as recited in claim 11, wherein said step of providing establishing means comprises the steps of providing first counter means, reset by said zero-pulses, and clocked by clock means, and providing second counter means, reset by said zero-pulses and clocked by an output of said first counter means.

14. A method as recited in claim 13, wherein said step of generating an error pulse when an interval between successive ones of said zero-pulses exceeds a preselected long window interval further comprises the steps of:

(a) providing a long window AND gate, a first input of which is connected to a selected output of said first counter means, and a second input of which is connected to a selected output of said second counter means; and (b) providing a long window flip-flop, set by an output of said long window AND gate, and reset by said zero-pulses.

15. A method of detecting noise and generating squelch signals, comprising the steps of:

(a) receiving an analog signal;

(b) generating a plurality of zero-pulses corresponding to zero-transitions of said analog signal;

(c) generating an error pulse when an interval between any one of said zero-pulses and a next succeeding one of said zero-pulses either (i) exceeds a preselected long window interval or (ii) is less than a preselected short window period; and (d) generating, in response to said error pulse, a squelch signal, wherein said step of generating an error pulse when an interval between successive ones of said zero-pulses is less than said preselected short window period comprises the step of:

(i) providing means for establishing a time delay equal to said preselected short window period, said establishing means being reset by each one of said zero-pulses.

16. A method as recited in claim 15, wherein said step of generating, in response to said error pulses, a squelch signal, comprises the step of providing a one-shot which receives said error pulses.

17. A method as recited in claim 15, wherein said step of generating a plurality of zero-pulses corresponding to zero-transitions of said analog signal comprises the steps of:

(a) squaring said received analog signal to produce a squared signal;

(b) differentiating said squared signal to produce a differentiated signal; and (c) full-wave rectifying said differentiated signal.

18. A method as recited in claim 15, wherein said step of generating, in response to said error pulses, a squelch signal, comprises the step of providing a one-shot which receives said error pulses.

19. A method as recited in claim 15, wherein said step of providing establishing means comprises the steps of providing first counter means, reset by said zero-pulses and clocked by clock means, and providing second counter means, reset by zero-pulses and clocked by an output of said first counter means.

20. A method as recited in claim 19, wherein said step of generating an error pulse when an interval between successive ones of said zero-pulses is less than a preselected short window period further comprises the steps of:

(a) providing a first short window AND gate, a first input of which is connected to a selected output of said first counter means, and a second input of which is connected to a selected output of said second counter means;

(b) providing a short window flip-flop, set by an output of said first short window AND gate, and reset by said zero-pulses; and (c) providing a second short window AND gate, a first input of which is connected to an output of said short window flip-flop, and a second input of which receives said plurality of zero-pulses.

* * * * *